United States Patent [19]
Ikemoto et al.

[11] Patent Number: 6,074,697
[45] Date of Patent: *Jun. 13, 2000

[54] METHOD FOR FORMING AN ELECTRODE PATTERN SUCH AS A PATTERN OF INPUT-OUTPUT ELECTRODES OF DIELECTRIC RESONATORS

[75] Inventors: Takashi Ikemoto, Shiga-ken; Satoru Kawaguchi, Kusatsu, both of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/999,313

[22] Filed: Dec. 29, 1997

[30] Foreign Application Priority Data

Jan. 6, 1997 [JP] Japan .................................. 9-000340
Nov. 7, 1997 [JP] Japan .................................. 9-305933

[51] Int. Cl.⁷ .................................. B05D 3/12; B05D 5/12
[52] U.S. Cl. .................. 427/272; 427/123; 427/126.2; 427/282; 427/349; 427/77
[58] Field of Search ................. 427/98, 123, 126.2, 427/272, 282, 349, 367, 295, 77; 216/13, 45, 52, 89, 105

[56] References Cited

U.S. PATENT DOCUMENTS

| | | | |
|---|---|---|---|
| 4,232,059 | 11/1980 | Proffitt | 427/96 |
| 4,952,420 | 8/1990 | Walters | 427/97 |
| 5,120,572 | 6/1992 | Kumar | 437/60 |
| 5,347,712 | 9/1994 | Yasuda et al. | 29/852 |
| 5,578,974 | 11/1996 | Yang et al. | 333/187 |

*Primary Examiner*—Shrive Beck
*Assistant Examiner*—Michael Barr
*Attorney, Agent, or Firm*—Ostrolenk, Faber, Gerb & Soffen, LLP

[57] ABSTRACT

An electrode pattern can be formed on a ceramic electronic part by removing part of a conductive film formed on the surface of a sintered ceramic body, by the following steps: 1) forming a conductive film on the surface of the ceramic body; 2) placing a mask on the conductive film, the mask having an opening corresponding to the electrode pattern to be formed, 3) blasting the ceramic body with an abrasive material so as to remove the conductive film in a region corresponding to the opening in the mask, and 4) removing the mask from the conductive film. The mask is reusable for being repeatedly placed on and removed from conductive films on respective ceramic bodies.

20 Claims, 2 Drawing Sheets

FIG. 3
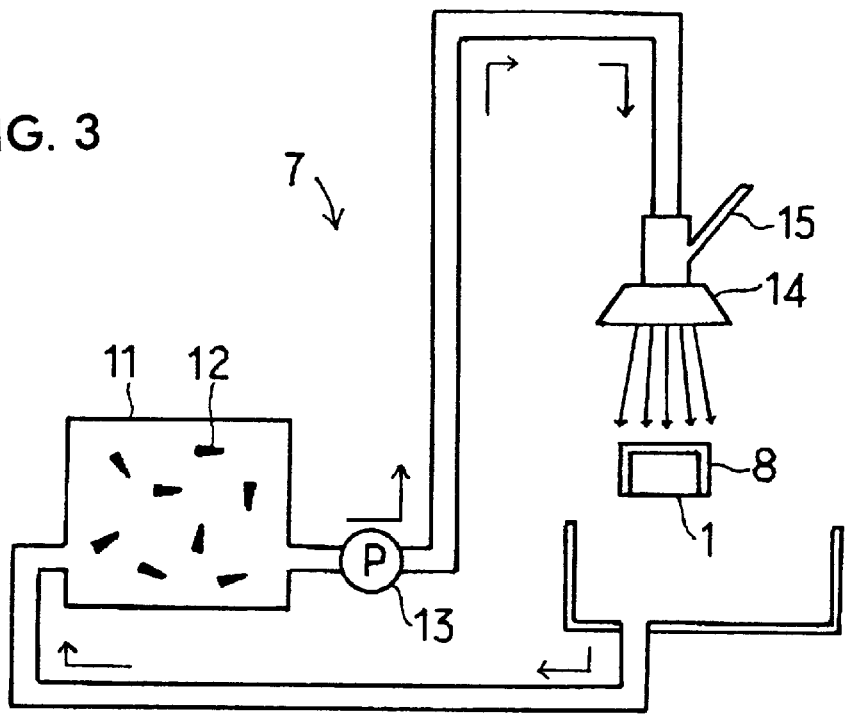
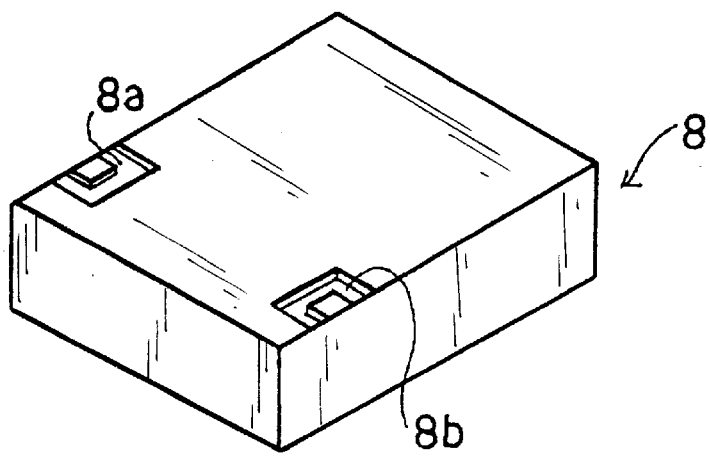
FIG. 4
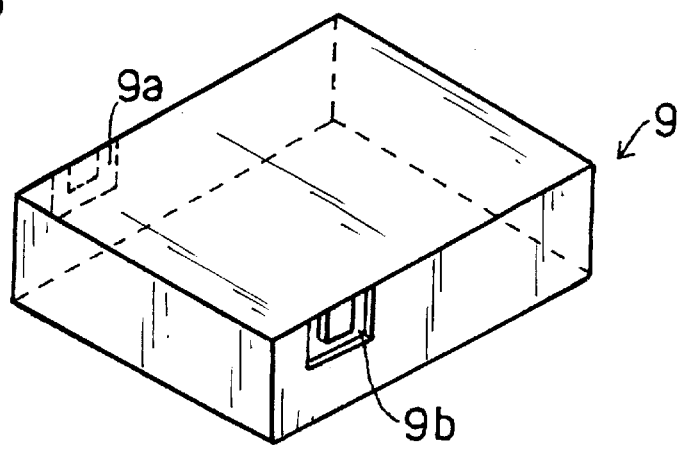
FIG. 5

METHOD FOR FORMING AN ELECTRODE PATTERN SUCH AS A PATTERN OF INPUT-OUTPUT ELECTRODES OF DIELECTRIC RESONATORS

BACKGROUND OF THE INVENTION

1. Field of the Invention

The present invention relates to a method for forming an electrode pattern on the surface of ceramic electronic parts made of sintered ceramic and more particularly to a method for forming input-output electrodes of dielectric resonators.

2. Description of the Related Art

Conventionally, dielectric resonators made of a sintered ceramic material composed of dielectric ceramic are known. Such types of dielectric resonators include, for example, dielectric coaxial resonators with through holes made in a dielectric block formed from a sintered ceramic material, inner conductors each formed on the inner peripheral surface of one of the through holes, and an outer conductor provided on the outer surface of the dielectric block. Furthermore, input-output electrodes are formed on the outer surface of the dielectric block such that they are electrically insulated from the outer conductor.

Conventionally, various methods have been employed for forming the above-mentioned outer conductor and input-output electrodes.

The first method is carried out as follows: on the outer surface of a dielectric block, a resist is applied to a region between regions where the input-output electrodes are to be formed and a region for forming the outer conductor; a conductive film is provided on the entire outer surface of the dielectric block by plating; and then, the resist is removed. According to this method, the conductive film is not formed on the region having the resist thereon. Thus, the input-output electrodes and outer conductor are prepared by removing the resist after plating.

The second method proceeds as follows: a mask is provided on the outer surface of a dielectric block such that regions for forming the input-output electrodes and a region for forming the outer conductor remain uncovered; and then a silver paste, etc. is applied by screen printing so as to form the input-output electrodes and outer conductor.

The third method is disclosed in Japanese Patent Laid-Open No. 6-334414 and carried out as follows: a conductive film is applied on the entire outer surface of a dielectric block by plating; and then, the conductive film is partially removed by contacting it with a cutting tool which is vibrated by an ultrasonic machine so as to separate the film into the input-output electrodes and outer conductor.

The fourth method is disclosed in Japanese Patent Laid-Open No. 7-321519 and carried out as follows: a conductive film is applied on the entire surface of a dielectric block by plating; and then, a resist-masking formed of a resist film material is laminated on part of the conductive film; and then, the part of the conductive film not covered by the resist-masking is removed by sandblasting.

According to the first method, numerous steps, such as resist application, plating, and resist removal, are required for forming the input-output electrodes and outer conductor. As a result, the cost increases because of the use of the resist and the productivity becomes insufficient.

According to the second method, the mask can be repeatedly used and the number of steps is lower than that of the first method. However, since each of the input-output electrodes of dielectric resonators is generally formed over two faces, the input-output electrodes and outer conductor cannot be accurately formed with high productivity by covering the dielectric block with a mask and applying a conductive paste by screen printing.

According to the third method, the input-output electrodes and outer conductor are formed by a simplified process wherein a conductive film is applied on the entire outer surface of the dielectric block by plating, and then, the conductive film is partially removed. However, the step of partially removing the conductive film using the cutting tool vibrated by the ultrasonic machine must be carried out separately for each of the dielectric blocks. In other words, it is impossible to process numerous dielectric blocks at the same time, resulting in insufficient productivity. In addition, since the cutting tools readily get worn out, it is necessary to frequently exchange the tools, and high mounting accuracy is required. Therefore, tool exchange takes a considerably long time-period. As a result, although the process for forming the conductive film is simplified, the productivity of the step for separating the input-output electrodes and outer conductor is insufficient.

According to the fourth method, after the step of laminating the resist-masking on the outer surface of the dielectric block and the step of removing the part of the conductive film not covered by the resist-masking, a cumbersome step using a solvent for removing the resist-masking must be carried out. As a result, like the first method, the cost increases because of the resist material and the resist-masking which can not be used repeatedly, and the productivity becomes insufficient.

SUMMARY OF THE INVENTION

Accordingly, it would be desirable to provide a method for forming electrode patterns of ceramic electric parts, by which method an electrode pattern composed of a plurality of conductive portions, such as input-output electrodes and a conductor, can be highly accurately formed at low cost on the outer surface of a sintered ceramic material by a simple process. It would further be desirable to provide a method for forming input-output electrodes of dielectric resonators having such an electrode pattern.

The present invention provides a method for forming an electrode pattern of a ceramic electronic part comprising a ceramic body, comprising the steps of: 1) forming a conductive film on the surface of said ceramic body; 2) placing a mask on said conductive film on the surface of said ceramic body to cover said conductive film, in which said mask has an opening and is reusable, 3) blasting said ceramic body with an abrasive material so as to remove part of said conductive film in a region corresponding to said opening of said mask, and 4) removing said mask from said conductive film.

According to the invention, differently from the method using an ultrasonic machine, numerous ceramic bodies can be processed at the same time. In addition, according to the invention, no tool changing step is required because the conductive film is removed by blasting an abrasive material using a blast apparatus. In contrast, in the case of using an ultrasonic machine, tool exchange takes a considerably long time-period and deteriorates the productivity.

Therefore, according to the invention, a conductive film can be partially removed in a reliable manner by simply forming the conductive film on the surface of a ceramic body and blasting an abrasive material using a blast apparatus.

In addition, the above mask can be repeatedly placed on and removed from different ceramic bodies. Therefore, the process is simplified and cost is reduced. The mask is comprised of a material having appropriate elasticity. A mask made of such an elastic material is easily applied to the ceramic body, taken off, and reused on another ceramic body. Rubber, especially urethane-rubber, is preferably used in view of its high resistance against sand-blasting, impact-resistance and long-life.

As a result, the formation of input-output electrodes of a ceramic electronic part, a dielectric resonator for example, can be readily and accurately carried out at low cost.

In the above method, said conductive film may be formed on the entire outer surface of said ceramic body in the step of forming a conductive film on the surface of said ceramic body.

In the above method, said conductive film may essentially consist of copper.

By using copper, the conductive film can be readily applied to the surface of a ceramic body at low cost by plating or the like, and furthermore, an electrode pattern having a low electrical resistance can be achieved.

The present invention will be better understood from the following embodiment taken in conjunction with the accompanying drawings.

BRIEF DESCRIPTION OF THE DRAWINGS

FIG. 3 is a diagrammatic view showing the structure of a blast apparatus used for blasting an abrasive material onto a conductive film.

FIG. 4 is a perspective view of a mask covering a conductive film.

FIG. 5 is a perspective view of another mask covering a conductive film.

DESCRIPTION OF EMBODIMENTS OF THE INVENTION

In the following description, a method for forming an electrode pattern on a ceramic electric part will be shown, which method is incorporated in the present invention and is applied to the formation of an electrode pattern, having input-output electrodes and an outer conductor, on the outer surface of a dielectric block of a dielectric coaxial resonator.

Figure 1:
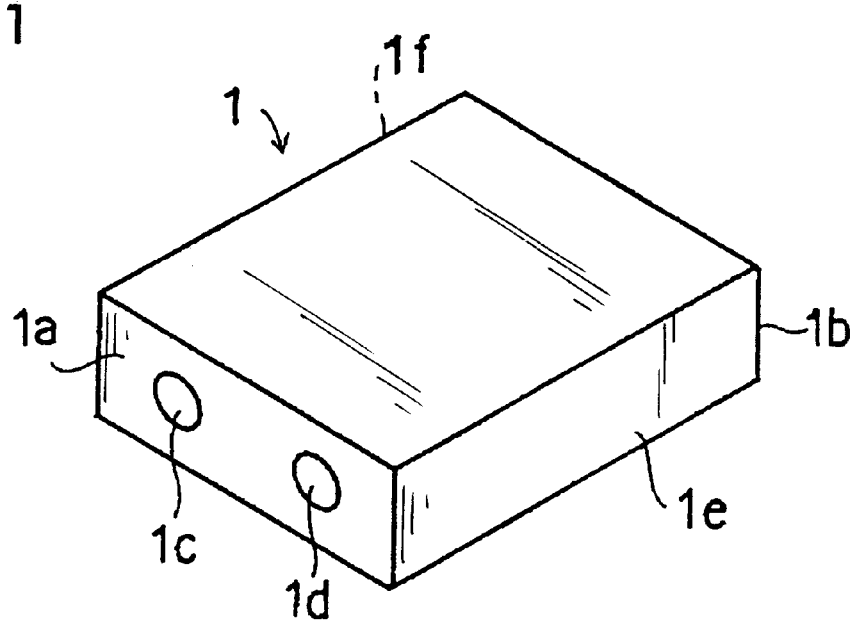
FIG. 1 is a perspective view of a dielectric block used in a method for forming an electrode pattern incorporated in the present invention.

FIG. 1 is a perspective view of a sintered ceramic dielectric block 1 to be used in a dielectric coaxial resonator. The dielectric block 1 is substantially rectangular and is made of a dielectric ceramic material having, for example, barium titanate as the main component. For forming a coaxial resonator, through holes 1c and 1d are made from the proximal end face 1a to the distal end face 1b of the dielectric block 1.

Figure 2:
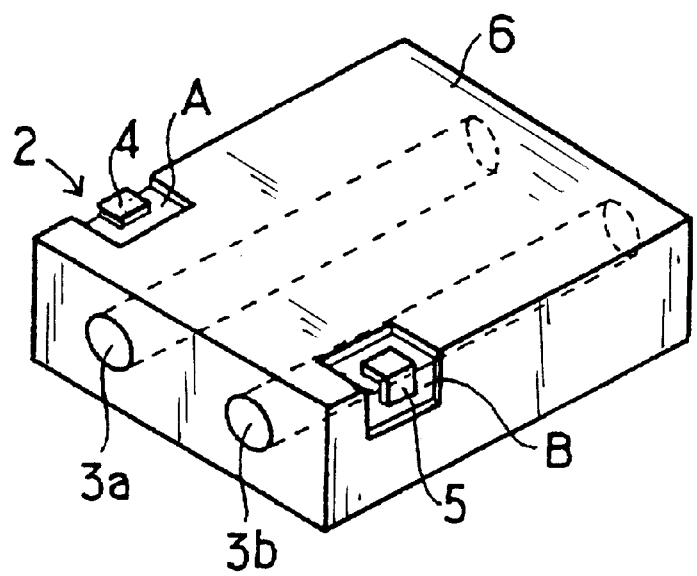
FIG. 2 is a perspective view of the dielectric block of FIG. 1 having input-output electrodes on its outer surface.

FIG. 2 shows a perspective view of a dielectric coaxial resonator 2 having a dielectric block 1 with electrodes thereon. Inner conductors are formed by providing a conductive film on the surfaces of the through holes 1c and 1d of the dielectric block 1. An outer conductor and input-output electrodes are formed on the outer surface of the dielectric block 1. The dielectric coaxial resonator 2 is provided with inner conductors 3a and 3b by forming a conductive film on the surfaces of the through holes 1c and 1d of the dielectric block 1. An outer conductor 6, electrically insulated from input-output electrodes 4 and 5, is formed on the outer surface of the dielectric block 1 except for the regions in which the input-output electrodes 4 and 5 are formed.

A method for forming an electrode pattern composed of the input-output electrodes 4 and 5 and the outer conductor 6 on the outer surface of the dielectric block 1 shown in FIG. 1 will be described below:

First, a conductive film is formed on the entire outer surface of the dielectric block 1. The method for forming the conductive film is not particularly limited, and plating, depositing, conductive-paste coating, sputtering, or the like may be employed. Among these methods, plating is preferable because the conductive film can be readily formed onto the entire outer surface of the dielectric block 1. Although the materials for the conductive film are not particularly restricted, a material essentially consisting of copper is preferably used because of its excellent conductivity, low cost, and readiness for plating.

After forming the conductive film on the entire outer surface of the dielectric block 1, the conductive film is covered with a mask 8 formed of urethane-rubber and blasted with an abrasive material using a blast apparatus. In other words, as is shown in FIG. 3, the dielectric block 1 covered with a mask 8 is arranged in a blast apparatus 7. The mask 8 has openings corresponding to the regions A and B shown in FIG. 2, i.e., the regions between the regions for forming the input-output electrodes 4 and 5 and the region for forming the outer conductor 6.

Preferably, two types of masks 8 and 9 shown in FIGS. 4 and 5, respectively, are employed for the above procedure. The mask 8 covers the top face and the end faces 1a and 1b and the side faces 1e and 1f (see FIG. 1) of the dielectric block 1. The top face of the mask 8 has U-shaped openings 8a and 8b. The mask 9 covers the top face and each of the end faces and the side faces of the dielectric block 1. The side faces of the mask 9 have openings 9a and 9b, as is shown in FIG. 5. The shapes of the openings 9a and 9b correspond to portions of the regions A and B positioned on the side faces of the dielectric block 1.

Referring to FIG. 3, the blast apparatus 7 has an abrasive material tank 11. The abrasive material tank 11 has an abrasive material solution 12, which is prepared by mixing abrasive grains, such as glass beads or alumina, and water. In addition to water, other suitable liquids can be used for dispersing the abrasive grains therein.

A pump 13 is connected to the abrasive material tank 11 so as to supply the abrasive material solution 12 to a high-pressure blast device 14. For supplying compressed air, a compressed air pipe 15 is connected to the high-pressure blast device 14. In the high-pressure blast device 14, the abrasive material solution 12 is blasted downward due to the compressed air. The dielectric block 1 is placed at the position toward which the abrasive material solution 12 is blasted. In this case, the abrasive material solution 12 is blasted onto the dielectric block 1 when the mask 8 is placed on the top face of the dielectric block 1. As a result, the conductive film in regions corresponding to the openings 8a and 8b of the mask 8 are blasted and removed by the abrasive material.

The blasting of the abrasive material is then stopped and the mask 8 is removed from the dielectric block 1. After placing the mask 9 shown in FIG. 5 on the dielectric block 1, the blasting is started again so as to remove the portions of the conductive film corresponding to the openings 9a and 9b.

As a result, the conductive film formed on the outer surface of the dielectric block 1 is separated into the input-output electrodes 4 and 5 and the outer conductor 6 shown in FIG. 2 by blasting using the masks 8 and 9.

The shapes of the masks 8 and 9 may vary according to the shapes of the desired input-output electrodes 4 and 5. Furthermore, it is not always required to employ two types of the masks 8 and 9 for blasting, and the conductive film in the regions between the input-output electrodes and the outer conductor may be removed using one type of mask.

When being placed on the dielectric block 1, the masks 8 and 9 are preferably pressed to the dielectric block 1 so that the conductive film can be removed corresponding to the shape of the openings of the masks 8 and 9 with high accuracy.

Preferably, the abrasive material is blasted at a constant pressure and the blasting device moves at a constant rate. The processing accuracy can be thereby improved so that the conductive film can be accurately removed according to the shape of the openings of the masks 8 and 9.

Blast apparatuses used for the present invention are not limited to the above type in which a mixture of an abrasive material and a liquid is blasted by compressed air. Dry-blast apparatuses directly blasting abrasive grains by compressed air, water-pressure blast apparatuses blasting a mixture of an abrasive material and a liquid by compressed water, and the like may be employed instead. Similarly to the above, portions of the conductive film corresponding to the openings of the masks 8 and 9 can be accurately and readily removed by any of such blast apparatuses.

A method for forming an electrode pattern of ceramic electronic parts incorporated in the present invention can be applied not only to the above method for forming the input-output electrodes 4 and 5 and the outer conductor 6 but also more generally to other methods for forming an electrode pattern by providing a conductive film on the outer surface of a sintered ceramic material and partially removing the conductive film. In such cases, the initially formed conductive film is not always required to cover the entire outer surface of the sintered ceramic material.

While the invention has been particularly shown and described with reference to preferred embodiments thereof, it will be understood by those skilled in the art that the foregoing and other changes in forms and details may be made therein without departing from the spirit of the invention.

What is claimed is:

1. A method for forming an electrode pattern on a ceramic electronic part comprising a ceramic body, comprising the steps of:
   1) forming a conductive film on the surface of said ceramic body,
   2) providing a first mask for masking said conductive film on said ceramic body, said first mask having an opening that exposes a first region of said conductive film to be removed from the surface of said ceramic body which forms a first part of said electrode pattern, said mask being reusable for being repeatedly placed on and removed from conductive films on respective ceramic bodies,
   3) placing said first mask on said conductive film on the surface of said ceramic body to cover said conductive film,
   4) blasting said ceramic body with an abrasive material so as to remove said conductive film in said region corresponding to said opening in said mask and thereby form said first part of said electrode pattern,
   5) removing said first mask from said conductive film,
   6) providing a second mask for masking said conductive film on said ceramic body, said second mask having an opening that exposes a second region of said conductive film to be removed from the surface of said ceramic body which forms a second part of said electrode pattern which is distinct from said first part, said second mask being reusable for being repeatedly placed on and removed from conductive films on respective ceramic bodies,
   7) placing said second mask on said conductive film on the surface of said ceramic body to cover said conductive film,
   8) blasting said ceramic body with an abrasive material so as to remove said conductive film in said second region corresponding to said opening in said second mask, and thereby form said second part of said electrode pattern, and
   9) removing said second mask from said conductive film, wherein removal of said conductive film in said first and second regions electrically isolates said electrode pattern formed in said conductive film from a remainder of said conductive film.

2. The method according to claim 1, wherein said conductive film is formed on the entire outer surface of said ceramic body in the step of forming a conductive film on the surface of said ceramic body.

3. The method according to claim 2, wherein said conductive film essentially consists of copper.

4. The method according to claim 1, wherein said conductive film essentially consists of copper.

5. The method according to claim 1, wherein said masks comprise elastic material.

6. The method according to claim 5, wherein said masks comprise rubber.

7. The method according to claim 6, wherein said masks comprise urethane rubber.

8. The method according to claim 1, wherein said first and second parts of said electrode pattern are formed electrically connected to each other.

9. The method according to claim 8, wherein said masks comprise rubber.

10. The method according to claim 9, wherein said masks comprise urethane rubber.

11. The method according to claim 8, wherein said first and second parts of said electrode pattern are formed in different respective planes on said surface of said ceramic body.

12. The method according to claim 1, wherein said first and second parts of said electrode pattern are formed in different respective planes on said surface of said ceramic body.

13. The method according to claim 12, wherein said different respective planes are mutually perpendicular.

14. A method for forming a pair of input-output electrodes on a dielectric resonator, comprising the steps of:
   1) forming a conductive film essentially consisting of copper on the entire outer surface of a ceramic body made of sintered ceramic material,
   2) providing a first mask for masking said conductive film on said ceramic body, said first mask having a pair of openings which form respective first parts of said pair of input-output electrodes to be formed, said mask being reusable for being repeatedly placed on and removed from such conductive films on respective ceramic bodies, 3) placing said first mask on said conductive film and blasting witht an abrasive material so as to remove said conductive film in regions corresponding to said openings of said first mask, thereby forming said respective first parts of said pair of input-output electrodes, and removing said first mask from said conductive film, 4) providing a second mask for masking said conductive film on said ceramic body, said second mask having a pair of openings which form respective second parts of said pair of electrodes to be formed, said second mask being reusable for being repeatedly placed on and removed from such conductive films on respective ceramic bodies, 5) placing said second mask on said conductive film on the surface of said ceramic body to cover said conductive film, and 6) blasting said ceramic body with an abrasive material so as to remove said conductive film in a region corresponding to said openings in said second mask, and thereby form said respective second parts of said pair of input-output electrodes, and 7) removing said second mask from said conductive film, wherein said first parts of said pair of input-output electrodes and said second parts of said pair of input-output electrodes comprise said input-output electrodes, and wherein removal of said conductive film in said regions corresponding to said openings in said first and second masks isolates each of said input-output electrodes from a remaining region of said conductive film.

15. The method according to claim 14, further comprising the steps of repeating steps (3) and (5)–(7) (3)–(5) and (7)–(9) with said mask being placed in steps (3) and (5) on another ceramic body.

16. The method according to claim 14, wherein said masks comprise elastic material.

17. The method according to claim 14, wherein said first and second parts of each of said input/output electrodes are formed electrically connected to each other.

18. The method according to claim 17, wherein said first and second parts of each of said input/output electrodes are formed in different respective planes on said outer surface of said ceramic body.

19. The method according to claim 14, wherein said first and second parts of each of said input/output electrodes are formed in different respective planes on said outer surface of said ceramic body.

20. The method according to claim 18, wherein said different respective planes are mutually perpendicular.

* * * * *